US005939720A

United States Patent [19]
Todokoro

[11] Patent Number: 5,939,720
[45] Date of Patent: Aug. 17, 1999

[54] SCANNING ELECTRON MICROSCOPE

[75] Inventor: Hideo Todokoro, Hinode-machi, Japan

[73] Assignee: Hitachi, Ltd., Tokyo, Japan

[21] Appl. No.: 09/062,480

[22] Filed: Apr. 17, 1998

[30] Foreign Application Priority Data

Apr. 18, 1997 [JP] Japan .................................. 9-101652

[51] Int. Cl.[6] .................................................. H01J 37/28
[52] U.S. Cl. ............................................................... 250/310
[58] Field of Search ..................................... 250/310, 311

[56] References Cited

PUBLICATIONS

Ultramicroscopy 41 (1992), p. 402 "Some Approaches to Low–Voltage Scanning Electron Microscopy".
SPIE—The International Society for Optical Engineering, vol. 2725 (1996), pp. 105–113, "Metrology Inspection, and Process Control for Microlithography X".

Primary Examiner—Edward P. Westin
Assistant Examiner—Nikita Wells
Attorney, Agent, or Firm—Kenyon & Kenyon

[57] ABSTRACT

A scanning electron microscope is provided. The scanning electron microscope can efficiently detect secondary electrons from a sample and reflected electrons irrespective of magnitudes of an acceleration voltage and a deceleration voltage using the retarding method. The scanning electron microscope comprises a sample holder 17; an electron beam source 1 for emitting an electron beam 19; scanning means 26, 27 for scanning the electron beam on the sample; an objective lens 3; a deceleration electric field generating means 20 for generating a deceleration electric field to decelerate the electron beam in the space above the sample 9; and detectors 150, 151 for detecting a secondary signal composed of at least one of secondary electrons 16 and reflected electrons 15 generated from the sample 9 by irradiation of the electron beam. The first detector 150 is arranged at a position in which the secondary signals 15, 16 can collide with the first detector to detect the secondary signals 15, 16 and to further emit secondary electrons 16b by collision of the secondary signals 15, 16. The second detector 151 detects the secondary electrons 16b emitted from the first detector 150.

15 Claims, 12 Drawing Sheets

SCANNING ELECTRON MICROSCOPE

BACKGROUND OF THE INVENTION

The present invention relates to a scanning electron microscope and, more particularly, to a scanning electron microscope using a retarding method in which an acceleration voltage of a primary electron beam is reduced just before being incident on a sample.

The basic construction of a conventional common scanning electron microscope will be described below, referring to FIG. 1. An electron beam 19 emitted from an electron source, not shown, toward a sample 9 is deflected by a scanning coil 2 so as to two-dimensionally scan on the sample 9. The electron beam 19 passed through the scanning coil 2 is converged to a fine beam by an objective lens 3 composed of a magnetic path 4 and an exciting coil 5, and irradiated to the sample 9. By the irradiation of the electron beam 19, secondary electrons 16 and reflected electrons 15 of the electron beam 19 are generated.

The secondary electrons 16 generated from the sample 9 are attracted since their energy is as small as 2 eV and accelerated by an electric field 11 of the scintillator 612 applied with a positive high voltage (10 kV) to make the scintillator 612 emit light. The generated light is transmitted in a light guide 613 and enters into a photomultiplier 614 to be amplified and converted into an electric signal.

An outer cylinder 610 is provided to make an effective distribution of the attractive electric field 11.

Since the electrons 15 reflected by the sample 9 have nearly the same energy as an energy (for example, 10 kV) at the time when the electron beam 19 is irradiated onto the sample 9, the electrons 15 travel in a direction opposite to the traveling direction of the electron beam 19 as shown in FIG. 1 without being attracted by the electric field 11 of the scintillator 612, and are incident on the scintillator 6 to make it emit light. The light is transmitted in the light guide 7 and enters the photomultiplier 8 to be converted into an electric signal.

An image of the sample shape can be displayed by performing brightness modulation using output intensities of the photomultipliers 8 or 614 and displaying the signals on a CRT with corresponding to scanning positions of the scanning coil 2 on the sample 9.

For shape inspection on a silicone wafer after being processed in the semiconductor industry, an optical microscope was used in the past, but a scanning electron microscope has been used in recent years because lines of a semiconductor device become smaller and resolution of an optical microscope is insufficient. Since a sample to be observed in the semiconductor industry is an insulator in most cases, it is required that energy (acceleration voltage) of an irradiated electron beam (primary electron beam) is set below 1 kV in order to prevent the sample from being charged by the irradiation of electrons.

However, when the acceleration voltage is decreased in the scanning electron microscope, the primary electron beam becomes difficult to be converged thin. Therefore, a retarding method has been practically used in recent years. In the retarding method, a primary electron beam of high acceleration voltage (for example, 2 kV) is converged to a thin beam by an objective lens and then the acceleration voltage of the primary electron beam is decreased just before being incident on a sample by a deceleration electric field (for example, −1 kV) applied between the objective lens and the sample. An example of the retarding method is described in FIG. 3 on page 402 of Ultramicroscopy 41 (1992) or SPIE Vol.2725 (1996), pages 105–113.

The retarding method has an advantage in that chromatic aberration caused by energy deviation of the electron beam can be lessened and the electron beam can be converged to a thin beam since the energy of the electron beam at the time when the electron beam is passing through the objective lens 3 can be set to a desired energy higher than the energy at the time when the electron beam is irradiated on the sample. On the other hand, the retarding method has a problem in that the secondary electrons is difficult to be detected because the secondary electrons generated from the sample are accelerated by the deceleration electric field between the objective lens and the sample and sucked inside the objective lens, and travel toward the electron beam source under lens action of the objective lens while being focusing.

The technology described in the above-mentioned paper, SPIE Vol.2725 (1996), pages 105–113, discloses a construction in which in order to detect the accelerated secondary electrons, a reflecting plate made of a metal is arranged at a position nearer to the electron beam source side than the objective lens, and the accelerated secondary electrons are collided onto the reflecting plate to further generate secondary electrons (called as signal secondary electrons) from the reflecting plate, and then the signal secondary electrons are deflected by an electric field to be detected by a detector.

In order to reduce the chromatic aberration of the objective lens, it is preferable that the acceleration voltage of the primary electron beam at the time when passing through the objective lens is set to a high voltage. In the retarding method, the difference between the acceleration voltage and the deceleration voltage of the primary electron beam is the energy of the electron beam when being incident on the sample. The following cases can be considered. For example, a case where a primary electron beam having an acceleration voltage of 5 kV is decelerated by a deceleration electric field of −4 kV and then is incident on a sample, or a case where a primary electron beam having an acceleration voltage higher that the above is decelerated to 1 kV and then is incident on a sample. In the retarding method, the secondary electrons from the sample are, however, accelerated by the deceleration electric field, as described above. Therefore, when the deceleration voltage is, for example, −4 kV, the secondary electrons are accelerated to 4 kV.

In order to efficiently detect the secondary electrons from the sample using the reflecting plate described in SPIE Vol.2725 (1996), pages 105–113, it is necessary to generate the signal secondary electrons by the reflecting plate with high efficiency. It is known that, in general, an efficiency of generating secondary electrons becomes a highest value (above 1) when an energy of the primary electrons incident on an object is 300 V to 1 kV, and decreases when an energy of the primary electrons incident on an object exceeds 1 kV. Therefore, when the magnitude of the deceleration voltage is set to a value higher than 1 kV, the generating efficiency of the signal secondary electrons on the reflecting plate is decreased and the detection efficiency of the secondary electron from the sample is reduced because the energy of the secondary electrons collide with the reflecting plate exceeds 1 kV. As described above, in the detection method using the reflecting plate described above, there is a problem in that the energy of the electron beam at the time when the electron beam is passing through the objective lens cannot be increased too large because the detection efficiency is decreased when the magnitude of the deceleration voltage is set a value above 1 kV.

Further, regarding the reflected electrons reflected by the sample, the energy after being reflected is nearly the same as the energy when they are incident. For example, when an electron beam of 1 kV is incident on the sample, the energy of the reflected electrons is approximately 1 kV. The reflected electrons are accelerated up to the same voltage as the acceleration voltage of the electron beam by being further accelerated by the deceleration electric field between the objective lens and the sample. Therefore, even when the magnitude of the deceleration electric field is 1 kV, the generating efficiency of the signal secondary electrons on the reflecting plate is decreased because the reflected electrons collide against the reflecting plate with 2 kV. Consequently, the method using the reflecting plate described above has a problem in that the reflected electrons cannot be efficiently detected.

SUMMARY OF THE INVENTION

An object of the present invention is to provide a scanning electron microscope which can efficiently detect the secondary electrons from the sample and the reflected electrons irrespective of magnitudes of the acceleration voltage and the deceleration voltage using the retarding method.

In order to attain the above object, the present invention provides a scanning electron microscope described below.

That is, the present invention provides a scanning electron microscope comprising a sample holder for holding a sample; an electron beam source for accelerating the electrons and emitting an electron beam toward the sample; scanning means for scanning the electron beam on the sample; an objective lens for converging the electron beam on the sample; a deceleration electric field forming means for forming a deceleration electric field to decelerate the electron beam in a space above the sample; and a detector for detecting a secondary signal composed of at least one of secondary electrons and reflected electrons generated from the sample by irradiation of the electron beam, wherein the detector comprises a first detector and a second detector, the first detector being arranged at a position in which the secondary signal can collide with the first detector, having a construction to detect the secondary signal and to further emit secondary electrons by collision of the secondary signal, the second detector detecting the secondary electrons emitted from the first detector.

DESCRIPTION OF EMBODIMENTS

Figure 1:
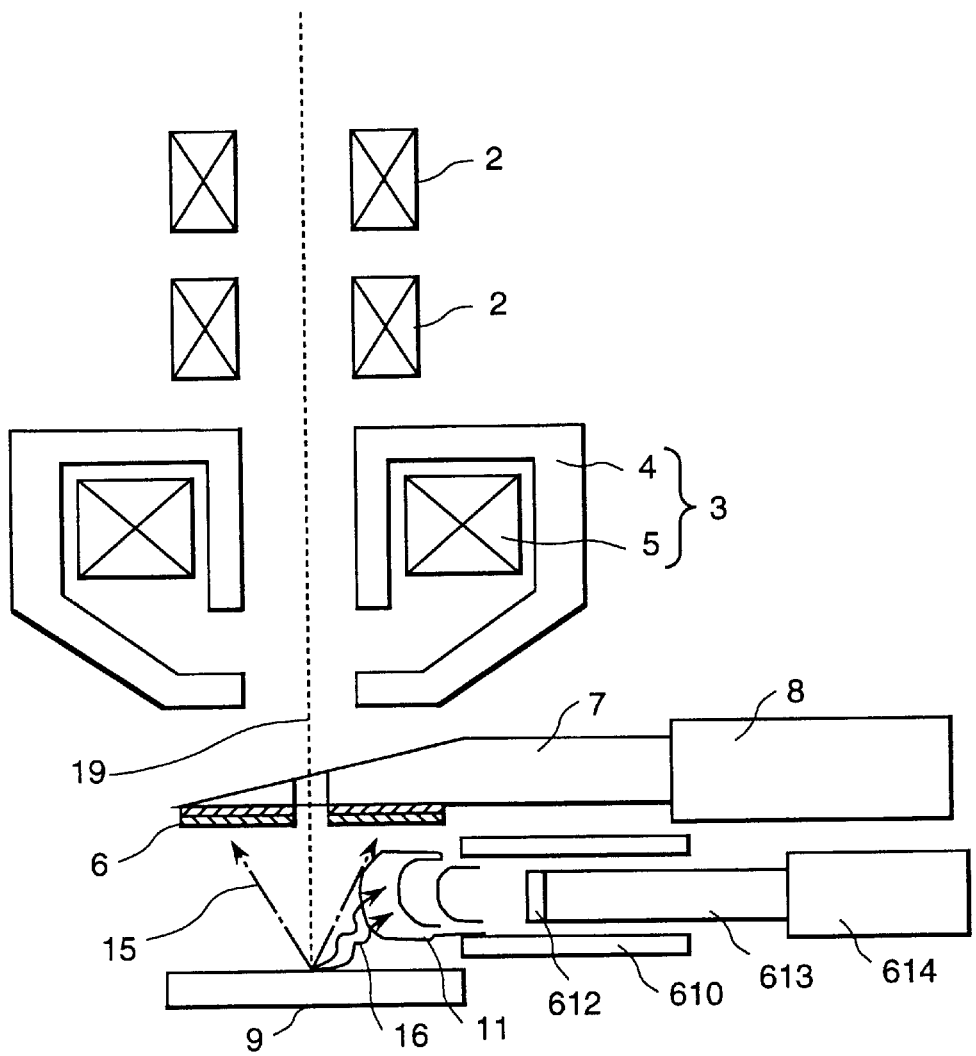
FIG. 1 is a block diagram partially explaining the basic construction of a conventional scanning electron microscope.

Embodiments of a scanning electron microscope in accordance with the present invention will be described below, referring to the accompanied drawings.

Initially, a first embodiment of a scanning electron microscope will be described, referring to FIG. 3.

A sample 9 is mounted on a conductive sample holder 17. The sample holder 17 is mounted on a sample stage 119 through an insulator 18 for adjusting the horizontal position.

An electron beam source 1 is arranged so as to be opposite to the sample 9. On the axis of the electron beam between the electron beam source 1 and the sample 9, there are arranged a condenser lens 28, an aperture 25, an upper scanning coil 26, a lower scanning coil 27, a scintillator 39, a secondary electron deflection unit 101, and an objective lens 3 in this order.

Figure 14:
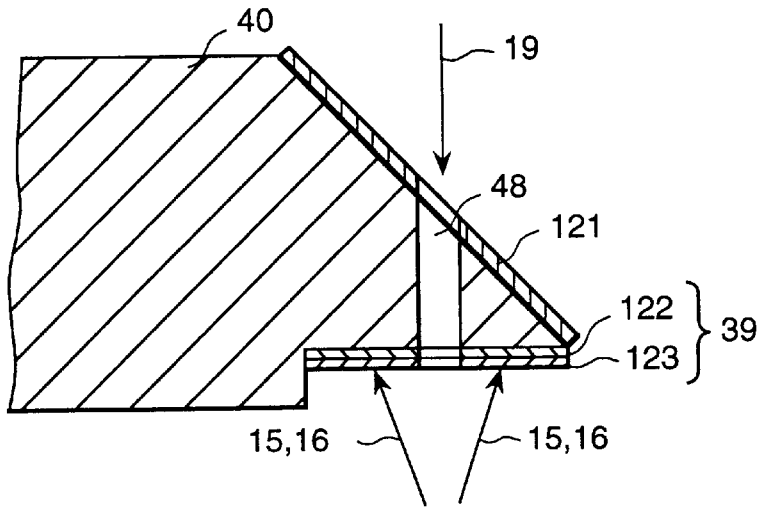
FIGS. 14(a), 14(b) and 14(c) are a cross-sectional view along a line A–A' of FIG. 14b), a bottom view and a side view, respectively, each showing the construction of the light guide 40 and the scintillator 39 of the first detector in the scanning electron microscope of FIG. 3.
Figure 14:
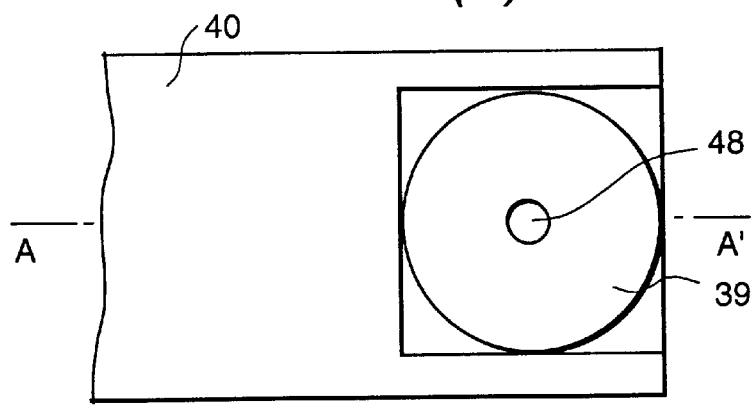
Figure 14:
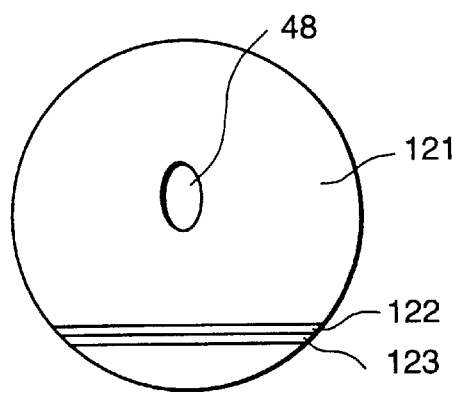

The scintillator 39 is arranged on a surface in the bottom side of a light guide 40 having a round rod shape an end portion of which is cut at a bevel, as shown in FIG. 14 (a), (b) and (c). The scintillator 39 is composed of a light emitting layer 122, a metallic layer 123 covering the light emitting layer 122. The light emitting layer 122 arranged on the light guide 40 is made of a fluorescent material, a single crystal YAG or the like which emits light when electrons are irradiated. The metallic layer 123 is arranged to prevent the light emitting layer from being charged and to further emit secondary electrons (signal secondary electrons) by irradiation of secondary electrons from the sample in this embodiment. Therefore, the metallic layer 123 is made of Au or Al which has a high efficiency of generating secondary electrons. In addition to these, in order to totally reflect the light emitted from the light emitting layer 122 and to transmit it in the light guide 40, a reflection layer 121 is arranged on the upper side surface in the end of the light guide 40. The light guide 40 is made of acrylic resin or glass. In the end cut at a bevel of the light guide 40, there is provided a through hole 48 for allowing the electron beam 19 emitted from the electron beam source 1 to pass through. A photomultiplier 41 is attached to the opposite side end of the light guide 40. The scintillator 39, the light guide 40 and the photomultiplier 41 compose a first detector 150.

Figure 13:
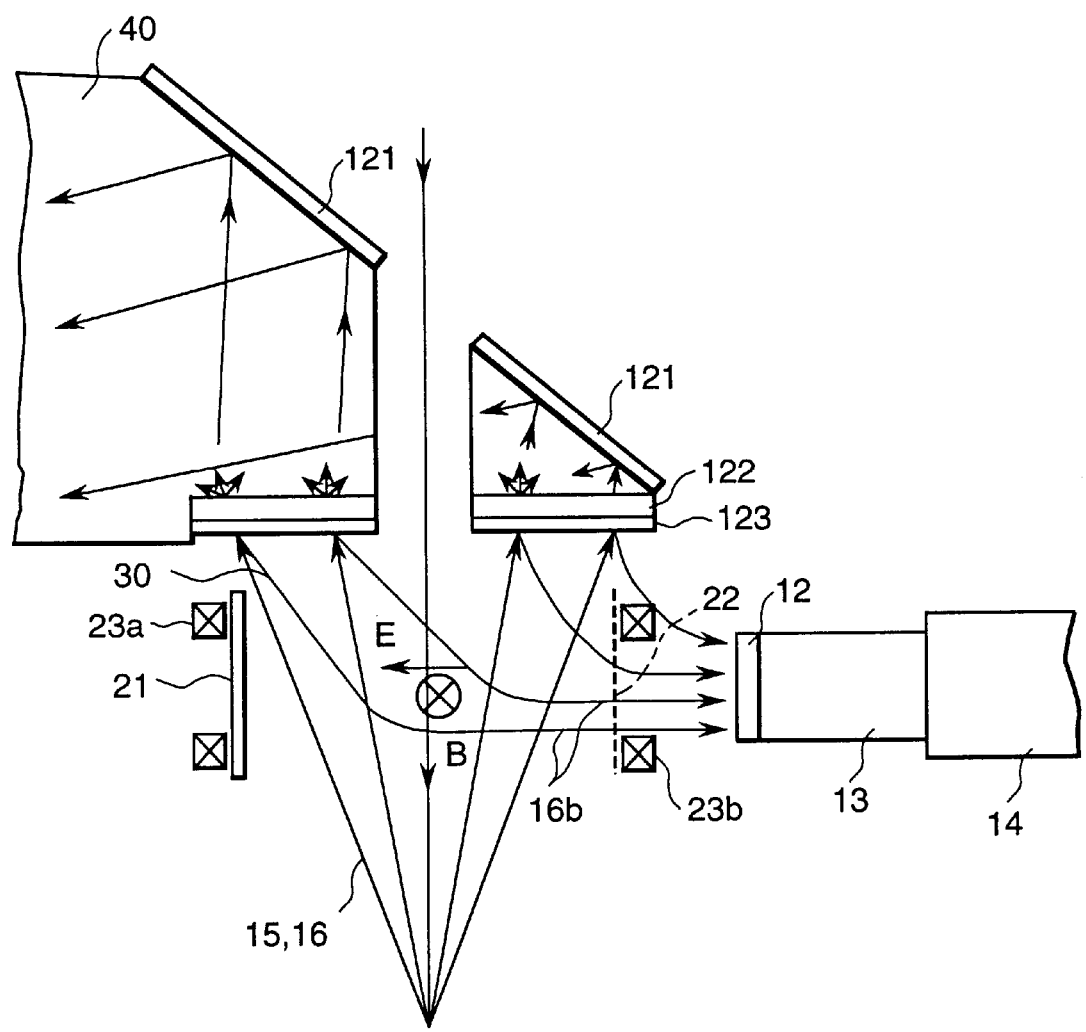
FIG. 13 is an explanatory view explaining light emission of the light emitting layer 122 of the first detector by the secondary electrons 16 and the reflected electrons 15 from the sample and deflection of the signal secondary electrons emitted from the metallic layer 123 of the first detector.

The secondary electron deflecting unit 101 is arranged in order to attract the signal secondary electrons 16b generated by the metallic layer 123 of the scintillator 39 in a direction intersecting with the axis of the electron beam at right angle. The secondary electron deflecting unit 101 is composed of a pair of deflection electrodes 21, 22 and a pair of deflection coils 23a, 23b, as shown in FIG. 3 and FIG. 13. The deflection electrodes 21, 22 are arranged so that an attracting electric field E is applied in a direction intersecting with the axis of the electron beam 19 at right angle. The deflection coils 23a, 23b are arranged in such a direction as to intersect with the attracting electric field E at right angle and so that a magnetic field B is applied in a direction intersecting with the axis of the electron beam 19 at right angle. The deflection electrode 22 to be applied with a positive voltage is a mesh electrode in order to allow the attracted signal secondary electrons 16b to pass through. The magnetic field B cancels deflection of the electron beam 19 by the attracting electric field E. Thereby, straightness of the electron beam 19 is maintained.

In the reverse side of the mesh-shaped deflection electrode 22, there is arranged a scintillator 12 for detecting the attracted signal secondary electrons. The scintillator 12 is arranged in one end of a light guide 13. A photomultiplier 14 is attached to the other end of the light guide 13. The scintillator 12, the light guide 13 and the photomultiplier 14 compose the second detector 151.

The reason why the deflection electrode 22 is made in mesh-shaped in this manner is to prevent a strong electric field generated by the scintillator 12 from influencing on the electron beam.

The photomultipliers 14, 41 are connected to an image controller, not shown, which forms image signals using outputs of the photomultipliers, by summing or separately, as brightness modulating signals and displays the sample image on a CRT.

The electron beam source 1 comprises an electron source 36 of Schottky type, a heating power source 38 for heating the electron source 36, a suppresser electrode 35, an extracting electrode 34, a control electrode 30 and an anode 29. The electron source 36 of Schottky type is heated by the heating power source 38. An extraction voltage 37 to the electron source 36 is applied to the extracting electrode 34, and thereby the electron source 36 emits electrons. A suppressing voltage 52 is applied to the suppresser electrode 35. The suppressing voltage 52 suppresses electrons to be emitted from portions other than the top end of the Schottky electron source 36 under a negative voltage. A control voltage 32 is applied to the control electrode 30 to control the path of the electron beam 19. An acceleration voltage 33 set to a required voltage is applied to the anode 29 and accelerate the electrons extracted from the electron source 36 to an acceleration voltage to form the electron beam 19.

The objective lens 3 is composed of a magnetic path 4 and an exciting coil 5. The magnetic path 4 is grounded. On the other hand, a negative superposed voltage 20 is applied to the sample 9 through the conductive sample holder 17. By doing so, a deceleration electric field for decelerating the electron beam 19 is formed in the space between the sample 9 and the objective lens 3.

Description will be made below on operation of each part in a case where the electron beam 19 having an energy of 1 kV is irradiated on the sample 9 with setting the acceleration voltage 33 to 6 kV and the superposed voltage 20 applied to the sample 9 to −5 kV.

The electron beam 19 emitted from the electron beam source with a high acceleration voltage of 6 kV is passed through the condenser lens 28 and the aperture 25, and then deflected by the upper scanning coil 26 and the lower scanning coil 27 so as to scan on the sample 9. At that time, the upper scanning coil 26 and the lower scanning coil 27 deflect the electron beam 19 so that the deflected electron beam 19 always passes through the center of the objective lens 3. By doing so, it is possible to prevent occurrence of aberration which is caused by displacing the electron beam 19 from the center of the objective lens 3. An aperture angle of the electron beam at the time when the electron beam is passing through the objective lens is determined by a magnitude of the opening of the aperture 25. An adjustment knob 53 is used for centering the aperture 25.

The electron beam 19 scanned by the upper scanning coil 26 and the lower scanning coil 27 passes through a through hole of the light guide 40 and the scintillator 39, and then passes through the secondary electron deflecting unit 101. At that time, the electron beam 19 is affected the effect of the attracting electric field E between the deflection electrodes 21, 22. However, the magnetic field of the deflection coils 23a, 23b act to cancel the effect. As a result, the electron beam 19 passes straight without receiving the effect of the secondary electron deflecting unit 101. The electron beam 19 traveling straight is converged fine by passing through the objective lens 3 to focusing on the sample.

Although an energy of the electron beam 19 at the time when the electron beam is passing through the objective lens 3 is a value corresponding to the acceleration voltage of 6 kv, the electron beam is decelerated by the deceleration electric field formed between the sample 9 and the objective lens 3. Therefore, an energy of the electron beam 19 at the time when the electron beam is incident on the sample 9 as the primary beam is a value equivalent to 1 kV which is the sum of the acceleration voltage 33 of 6 kV and the superposed voltage of −5 kV.

When the electron beam of 1 kV is incident on the sample 9, secondary electrons 16 are emitted from the sample 9 and reflected electrons 15 of the electron beam 19 reflected on the sample 9 is formed. Since the reflected electrons 15 is reflected upward having an energy equal to the electron beam 19 at the time when the electron beam is incident on the sample 9, the reflected electrons 15 has an energy of 1 kv at the time when they are reflected. On the other hand, an energy of the secondary electrons 16 is almost nearly 0 (zero) at the time when they are emitted.

The secondary electrons 16 generated from the sample and the reflected electrons 15 are accelerated by the deceleration electric field formed between the objective lens 3 and the sample 9, and sucked inside the objective lens 3. Then, the secondary electrons 16 and the reflected electrons 15 received the lens action of the magnetic field of the objective lens 3 are moving toward the electron beam source 1 while forming focuses. The secondary electrons 16 generated from the sample and the reflected electrons 15 upward moved collide with the scintillator 39. The acceleration voltage of the secondary electrons 16 at the time when collide with the scintillator 39 is 5 kV which is equal to the superposed voltage 20 of the deceleration voltage. The acceleration voltage of the reflected electrons 15 becomes 6 kV which is the sum of the 1 kV at the time when the electron beam is reflected and the superposed voltage 20 of 5 kV.

When the reflected electrons 15 and the secondary electrons 16 collide with the scintillator 39, secondary electrons (called as signal secondary electrons) are emitted from the metallic layer 123 on the surface of the scintillator 39. In a case where energy of the reflected electrons 15 and the secondary electrons 16 is large, the electrons pass through the metallic layer 123 and reach the light emitting layer 122 to make the light emitting layer 122 emit light.

The signal secondary electrons 16b emitted from the metallic layer 123 are deflected by the electric field formed by the deflection electrode 21 and the deflection electrode 22, passing through the mesh of the deflection electrode 22, being accelerated by the scintillator 12 applied with 10 kV (positive voltage), then colliding with the scintillator 12 to emit light. The light emitted is transmitted in the light guide 13 to be conducted to the photomultiplier 14 to be converted into an electric signal (detection by the second detector 151).

On the other hand, the light emitted in the light emitting layer 123 of the scintillator 39 by passing of the secondary electrons 16 and the reflected electrons 15 is reflected by the reflecting layer 121, being conducted in the light guide 40 to the photomultiplier 41, then being converted into an electric signal (detection by the first detector 150).

The image control unit, not shown, adds the electric signals of the photomultiplier 14 and the photomultiplier 40 to form a brightness modulation signal for the CRT, forming an image signal by corresponding it to scanning of the upper and lower scanning coils 26, 27, then displaying a sample image on the CRT.

Since the acceleration voltage 33 is set to 6 kV and the superposed voltage 20 is set to −5 kV in this embodiment, the energy of the secondary electrons 16 colliding with the scintillator is 5 kV and the energy of the reflected electrons 15 is 6 kV. In general, an efficiency of generating secondary electrons becomes a highest value above 1 when an energy of the primary electrons incident on an object is 300 V to 1 kV, and decreases when an energy of the primary electrons incident on an object exceeds 1 kV. Therefore, in a case of this embodiment, the generating efficiency of the signal secondary electrons 16b on the surface of the scintillator 39 is below 1 and consequently the output of the signal secondary electrons 16b by the second detector 151 is low. However, since the first detector 150 is constructed by arranging the light emitting layer 122 under the metallic layer 123 in this embodiment, the secondary electrons 16 of 5 kV and the reflected electrons 15 of 6 kV can be detected by the photomultiplier 41 of the first detector 150. Thus, in this embodiment, the secondary electrons 16 are efficiently detected by the second detector 151 when the magnitude of the superposed voltage 20 applied to the sample 9 is below 1 kV, and the secondary electrons 16 are efficiently detected by the first detector 150 when the magnitude of the superposed voltage 20 is above 1 kV. Further, the reflected electrons 15 can be efficiently detected by the second detector 151 when the acceleration voltage 33 is below 1 kV, and the reflected electrons 15 can be efficiently detected by the first detector 150 when the acceleration voltage 33 is above 1 kV.

Figure 3:
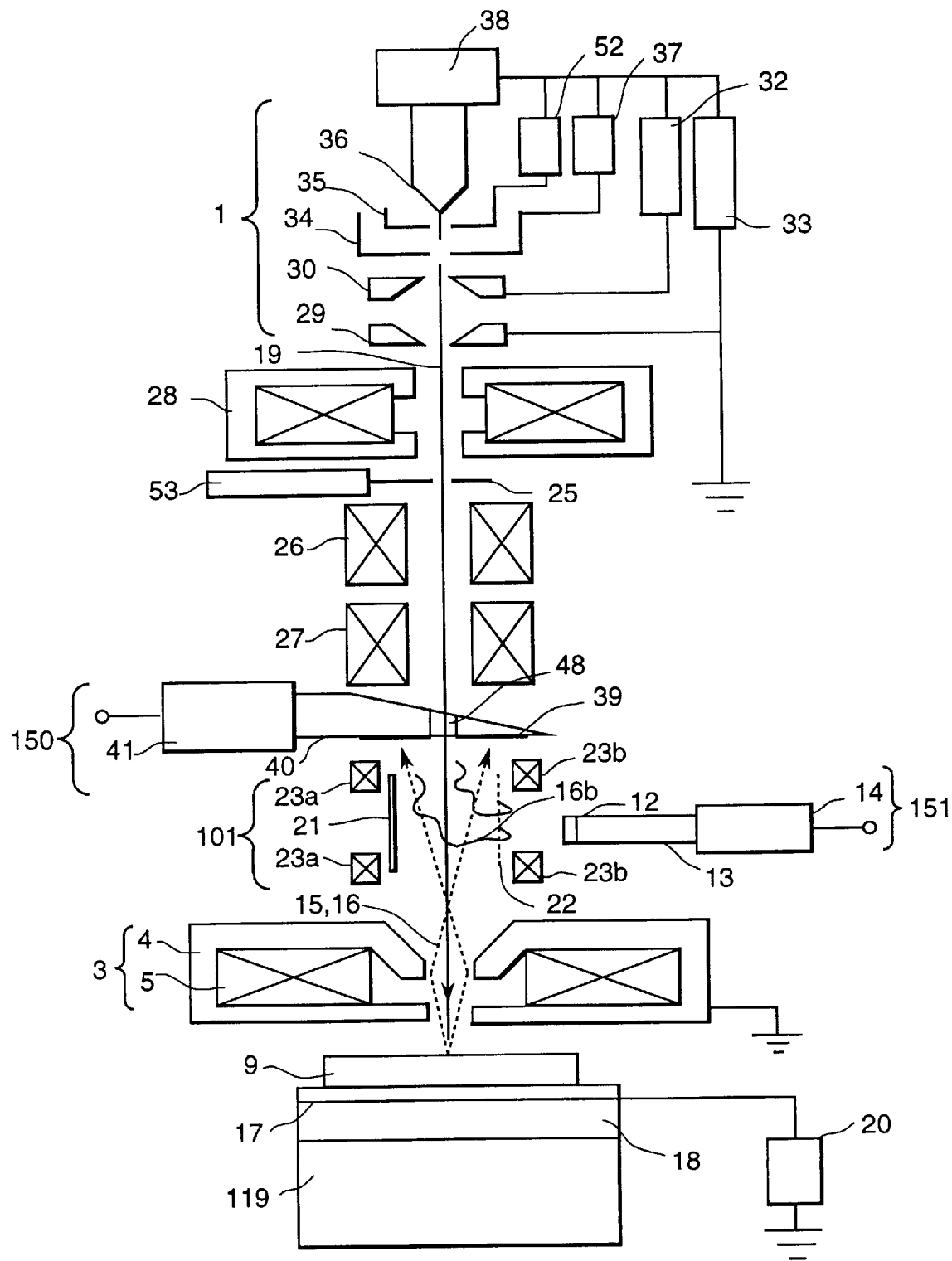
FIG. 3 is a block diagram showing the construction of a first embodiment of a scanning electron microscope of a retarding type in accordance with the present invention.

As described above, in this embodiment of the scanning electron microscope shown in FIG. 3, since the first detector 150 is constructed by arranging the light emitting layer 122 under the metallic layer 123 in this embodiment, the first detector 150 and the second detector 151 supplement the detection efficiency each other. Therefore, the reflected electrons 15 and the secondary electrons 16 from the sample 9 can be detected in a high efficiency.

Description will be made in detail below on the mutual supplement of the first detector 150 and the second detector 151, referring to FIG. 4 (*a*), (*b*) and FIG. 6 (*a*), (*b*).

Figure 4:
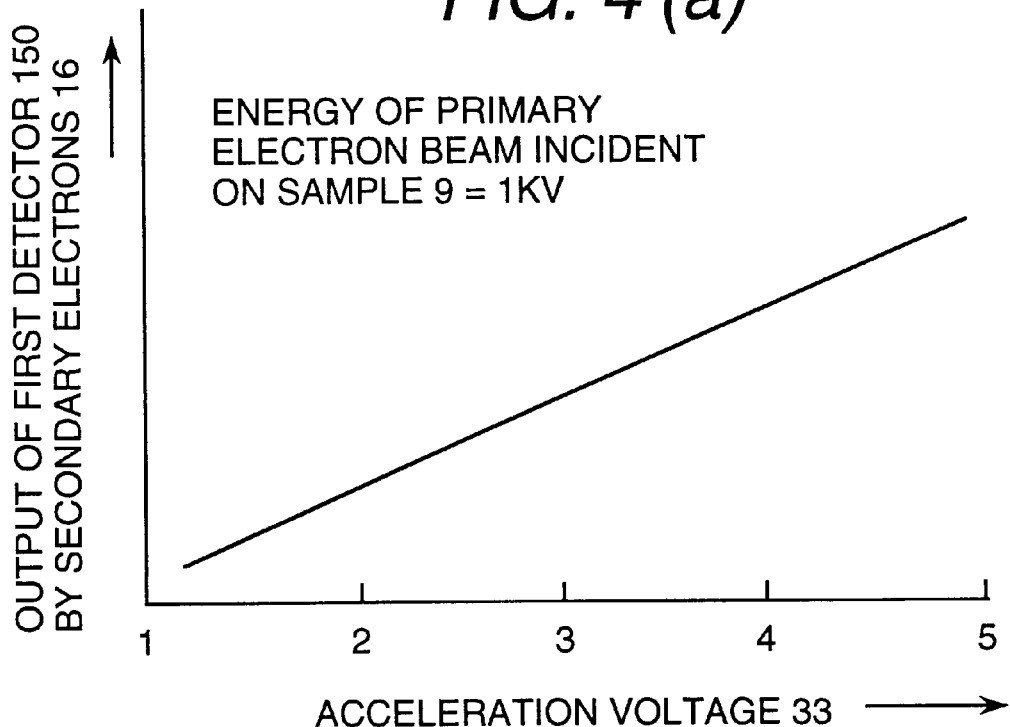
FIGS. 4(a) and 4(b) are graphs respectively, FIG. 4(a) showing change in an output of the first detector 150 and FIG. 4(b) showing change in an output of the second detector 151 by the secondary electrons 16 from the sample 9 in a case where the acceleration voltage 33 and the superposed voltage 20 are varied so that an energy of the electron beam at the time when the electron beam is incident on the sample 9 becomes 1 kV in the scanning electron microscope of FIG. 3.
Figure 4:
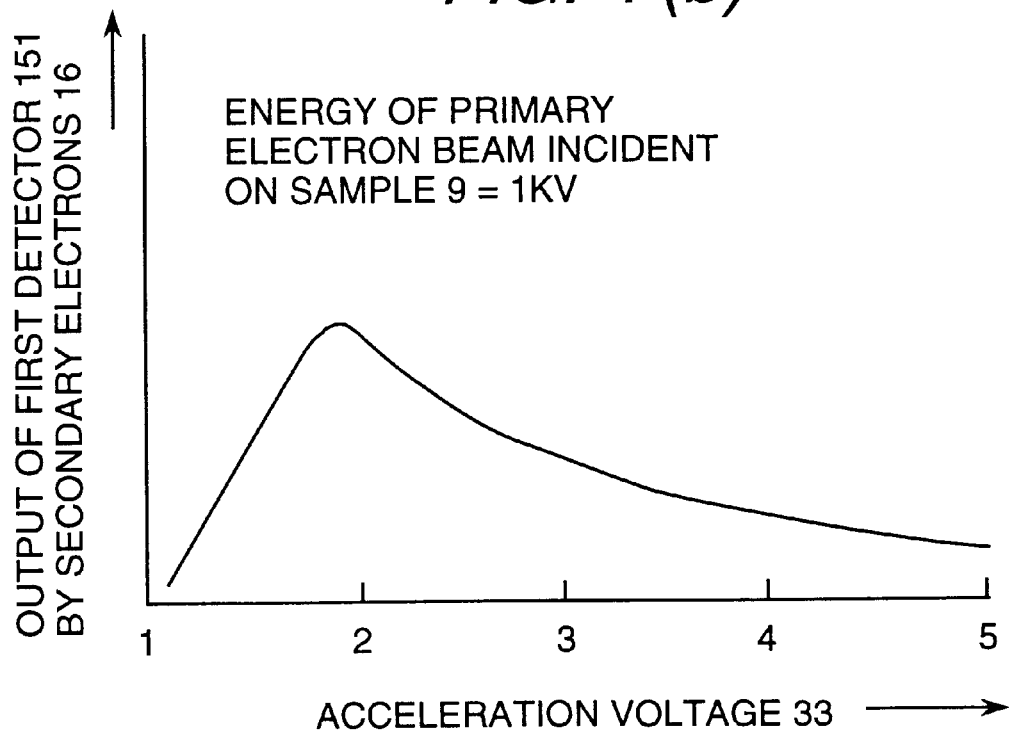

FIG. 4 (*a*), (*b*) respectively show output of the photomultiplier 41 of the first detector 150 and output of the photomultiplier 14 of the second detector 151 by the secondary electrons 16 when the magnitude of the superposed voltage 20 is varied while the acceleration voltage 33 is varied so that the energy of the electron beam 19 incident on the sample 9 is kept to 1 kV. Observation is performed under such a condition when the deceleration electric field is required to be adjusted depending on a material of the sample 9. It is clear from FIG. 4 (*a*) that the output of the photomultiplier 41 of the first detector 150 increases as the acceleration voltage 33 is increased. On the other hand, it is clear from FIG. 4 (*b*) that output of the second detector 151 becomes maximum at a point near the acceleration voltage of 2 kV which satisfies the energy of the secondary electrons 16 of 1 kV, and gradually decreases in the range of the acceleration voltage above 2 kV. When the output of the second detector 151 is decreased as the acceleration voltage 33 is increased, the output of the first detector 150 is increased. Therefore, the outputs of the both detectors supplement each other and consequently the decrease in the output can be prevented by adding the both outputs and the detection efficiency can be maintained above a certain value.

Figure 6:
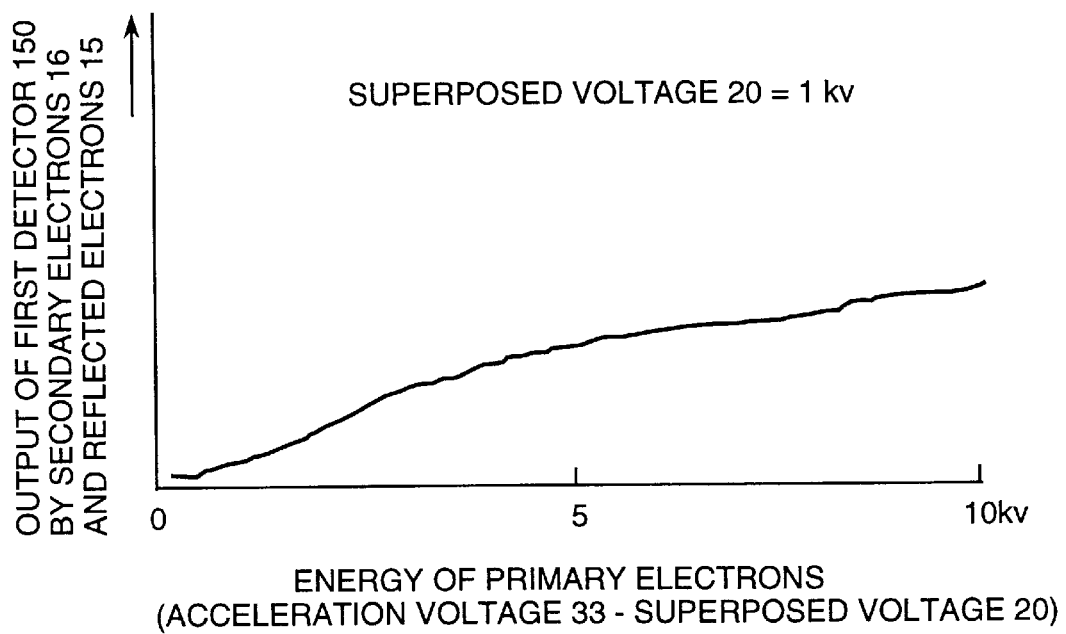
FIGS. 6(a) and 6(b) are graphs respectively, FIG. (a) showing change in an output of the first detector 150 and FIG. 6(b) showing change in an output of the second detector 151 by the secondary electrons 16 and the reflected electrons 15 in a case where the superposed voltage 20 is fixed to 1 kv and the acceleration voltage 33 is varied in the scanning electron microscope of FIG. 3.
Figure 6:
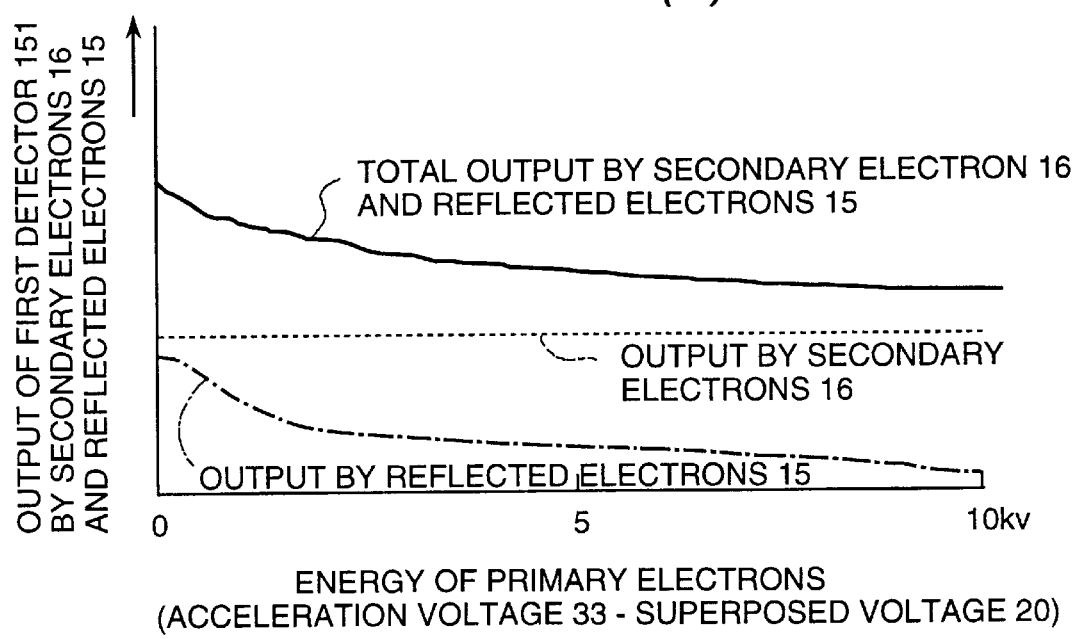

FIGS. 6 (*a*) and (*b*) respectively show output of the photomultiplier 41 of the first detector 150 and output of the photomultiplier 14 of the second detector 151 by the secondary electrons 16 when the magnitude of the superposed voltage 20 is fixed to 1 kv and the acceleration voltage 33 is varied. The reflected electrons 15 by the sample 9 are reflected upward with an energy nearly equal to the energy of the electron beam (primary electron beam) 19 at the time when the electron beam is incident on the sample 9. Therefore, the energy of the reflected electrons 15 at the time when the reflected electrons are sucked inside the objective lens 3 through the deceleration electric field is nearly the same as the acceleration voltage 33. On the other hand, since the energy of the secondary electrons 16 at the time when emitted from the sample is nearly 0 (zero), the energy of the secondary electrons 16 at the time when sucked into the objective lens 3 through the deceleration electric field is equal to the superposed voltage 20 (1 kV).

Therefore, regardless of the energy of the acceleration voltage 33, the secondary electrons 16 can very effectively generate a constant amount of signal secondary electrons 16b at the time when the secondary electrons 16 collide with the scintillator 39 since the energy of the secondary electrons 16 is always 1 kV in this case. Accordingly, the output of the second detector 151 by the secondary electrons 16 is always a constant output regardless of the energy of the primary electron beam, as shown in FIG. 6 (*b*). On the other hand, when the acceleration voltage 33 is approximately 1 kV (the energy of the primary electron beam is nearly 0), the reflected electrons 15 efficiently generate the signal secondary electrons 16b since the reflected electrons 15 colliding with the scintillator 39 is nearly 1 kV. However, when the acceleration voltage 33 becomes higher (the energy of the primary electron beam 19 becomes higher), the generating efficiency is decreased. Therefore, the output of the second detector 151 is the sum of the secondary electrons 16 and the signal secondary electrons 16b by the reflected electrons 15, and gradually decreases as the acceleration voltage 33 is increased, as shown by the solid line in FIG. 6 (b).

Further, as shown in FIG. 6 (a), when the energy of the primary electron beam 19 becomes higher, the output of the first detector 150 is gradually increased because the light emitting efficiency of the scintillator 39 increases.

Thus, by adding the outputs of the both detectors as in this embodiment to supplement the decrease in the outputs of FIG. 6 (a), (b) each other, the secondary electrons 16 and the reflected electrons 15 can be efficiently detected and the detection efficiency can be maintained above a certain value.

As described above, in the first embodiment of the scanning electron microscope, by arranging the second detector 151 which can detect the signal secondary electrons 16b emitted by collision of the reflected electrons 15 and the secondary electrons 16 and by arranging the first detector 150 which can detect light emitted in the light emitting layer, when energy of the reflected electrons 15 and the secondary electrons 16 is large, the reflected electrons 15 and the secondary electrons 16 can be always detect efficiently regardless of the acceleration voltage 33 and the superposed voltage 20. Therefore, it is possible to obtain a scanning image of the sample 9 having higher resolution by setting the acceleration voltage 33 to a higher voltage compared to a conventional one and by decreasing the chromatic aberration of the condenser lens 28 and the objective lens 3.

As described above, what the photomultiplier 41 of the first detector 150 detects is the reflected electrons 15 and the secondary electrons 16 having an energy that can transmit the metallic layer 123 to reach the light emitting layer 122. The reflected electrons 15 have an energy equal to the acceleration voltage 33 when collide with the first detector 150, and the secondary electrons 16 have an energy equal to the superposed voltage 20. By adjusting the thickness of the metallic layer 123, it is possible to select electrons reaching the light emitting layer 122 according to energy. Therefore, it is possible to select and detect energy of electrons detected by the photomultiplier 41 of the first detector 150 by the thickness of the metallic layer 123 according to the thickness of the metallic layer 123.

For example, the thickness of the metallic layer 123 is set to a thickness (for example, approximately 20 nm) which does not allow electrons having an energy below 1 kV to pass through but allows electrons having an energy above 1 kV to pass through. In this case, when the magnitude of the superposed voltage 20 is set to 1 kV and the acceleration voltage is set to a voltage higher than 1 kV, the secondary electrons 16 generate the signal secondary electrons 16b at the metallic layer 123 but cannot reach the light generating layer 122 because the secondary electrons 16 collide with the metallic layer 123 with 1 kV. On the other hand, the reflected electrons 15 can reach the light generating layer 122 to generate light though the generation of the signal secondary electrons 16b is little because the reflected electrons 15 have an energy larger than 1 kV which is equal to the acceleration voltage. Therefore, the reflected electrons 15 are detected by the photomultiplier 41 of the first detector 150, and the secondary electrons 16 are detected by the photomultiplier 14 of the second detector 151. Accordingly, the reflected electrons 15 and the secondary electrons 16 can be separately detected by the first detector 150 and the second detector 151.

In this case, the output of the first detector 150 and the output of the second detector 151 are not added, but one of them is selectively displayed on the CRT. By doing so, the sample image by the first detector 150 or the sample image by the second detector 151 can be selectively displayed.

Since an image by the reflected electrons can be selectively detected, a sample image also can be built on the basis of information particular to the reflected electrons. In the prior art disclosed SPIE Vol. 2725(1996) pages 103–113 which is previously referred to, secondary electrons obtained by impact on the reflection plate and secondary electrons deflected on the detector without impact on the reflection plate are detected by the same detector, so that the prior art has a problem that the former secondary electrons and the latter secondary electrons can not be distinguished.

The reflected electrons have more pieces of information concerning a surface structure of a sample than the secondary electrons. Therefore, if a sample image can be built on the basis of the reflected electrons, a surface structure analysis can be done better. On the contrary, there is a problem that the surface structure becomes obscure when information based on the secondary electrons have been mixed. According to the apparatus of the present embodiment, it is possible to solve the above problem because the reflected electrons can be selectively detected.

As mentioned above, an effect that can be attained by selectively detecting reflected electrons is described, and as mentioned previously, the technique that synthesizes outputs when secondary electrons and reflected electrons are detected is important to an improvement of detection efficiency. In the apparatus of the present embodiment, it is possible to selectively display a secondary electron image, a reflected electron image or an image formed by synthesizing the both according to an observation object.

Although the first detector 150 is constructed using the scintillator 39 in the first embodiment mentioned above, it is not limited to use the scintillator 39. By using a semiconductor detector having an opening to allow the electron beam 19 to pass through, output of the semiconductor detector can be used as the output of the first detector 150. In this case, the signal secondary electrons 16b generated on the surface of the semiconductor detector are detected by the second detector 151.

A second embodiment of a scanning electron microscope in accordance with the present invention will be described below, referring to FIG. 5. In the scanning electron microscope of FIG. 5, the first detector 150, the second detector 151 and the secondary electrons deflecting unit 101 are arranged between the upper and the lower scanning coils 26, 27 and the aperture 25. An advantage of such an arrangement is in that the diameter of the though hole 48 provided in the scintillator 39 and the light guide 40 can be made smaller than that in the case of FIG. 3.

The upper and the lower scanning coils 26, 27 scan the electron beam 19 that the electron beam 19 always passes through the center of the objective lens 3. Therefore, in the case of the construction of FIG. 3 where the first detector 150 is arranged between the upper and the lower scanning coils 26, 27 and the aperture 25, the through hole 48 of the light guide 40 needs to have a diameter capable of allowing the electron beam 19 being scanned to pass through the through hole. On the other hand, in the case of FIG. 5, the diameter of the through hole 48 can be made small because the first detector 150 is arranged nearer to the electron beam source side than the upper and the lower scanning coils 26, 27. In more detail, the diameter of the through hole 48 is required to be a diameter of approximately 4 mm in the construction of FIG. 3, but the diameter of the through hole 48 can be decreased to a diameter below 1 mm in the construction of FIG. 5.

As described above, since the diameter of the through hole 48 can be decreased to a diameter below 1 mm in the construction of FIG. 5, it is possible to decrease a ratio of number of electrons passing though the through hole 48 and not colliding with the scintillator 39 to the total number of the secondary electrons 16 and the reflected electrons 15 from the sample 9. Thus, the detection efficiency of the secondary electrons 16 and the reflected electrons 15 can be improved.

Figure 5:
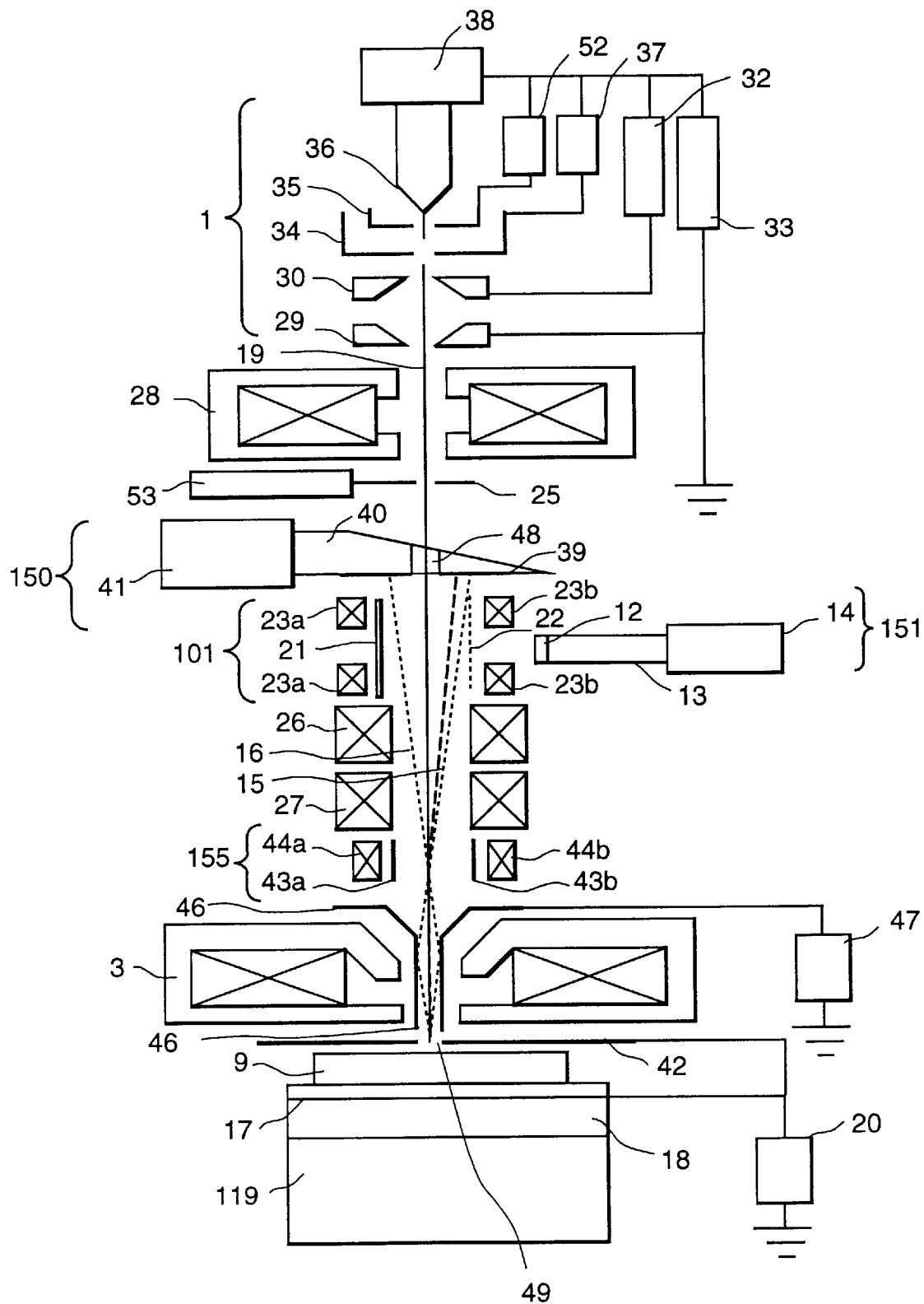
FIG. 5 is a block diagram showing the construction of a second embodiment of a scanning electron microscope of a retarding type in accordance with the present invention.

Further, in the embodiment of FIG. 5, a deflector 155 is arranged between the lower scanning coil 27 and the objective lens 3 in order to efficiently detect the reflected electrons 15 and secondary electrons 16 moving upward along the path of the electron beam 19. The deflector 155 is composed of a pair of electrodes 43a, 43b for applying a static electric field intersecting with the electron beam 19 at right angle and a pair of deflection coils 44a, 44b for applying a magnetic field intersecting with the electric field. The deflector 155 acts so as to cancel the deflection by the static electric field and the deflection by the magnetic field to the electron beam 19 progressing toward the sample 9, but gives deflection to the secondary electrons 16 and the reflected electrons 15 reversely traveling upward to the electron beam source 1 from the bottom side. As a result, a position where the reflected electrons 15 and the secondary electrons 16 collide with the scintillator 39 can be displaced from the through hole 48 to increase the detection efficiency. Particularly, since the reflected electrons 15 do not expand wider compared to the secondary electrons 16, the reflected electrons passing through the through hole 48 are decreased and consequently the detecting efficiency can be efficiently increased.

Further more, in the construction of FIG. 5, a post acceleration electrode 46 is arranged in the objective lens 3. By applying a positive post acceleration voltage 47 to the post acceleration electrode 46, acceleration of the electron beam 19 can be further increased when the electron beam is passing through the objective lens 3. By doing so, the chromatic aberration by the objective lens 3 can be further reduced. Therefore, a scan image of the sample 9 having a higher resolution can be obtained.

Further, in the construction of FIG. 5, an electric field control electrode 42 is arranged on the sample 9 so as to cover the sample 9. The electric field control electrode 42 has a control electrode aperture 49 for allowing the electron beam 19 to pass through. A voltage equal to the superposed voltage 20 applied to the sample 9 is applied to the electric field control electrode 42. By arranging the electric field control electrode 42 in such a manner, it is possible to form a deceleration electric field between the electric field control electrode 42 and the objective lens 3. Since the electric field control electrode 42 and the sample 9 are in the same voltage, no or weak electric field is formed between them. Therefore, there is an advantage in that the deceleration electric field can be formed without applying a strong electric field on the sample 9. Thereby, it is possible to prevent damage of the sample caused by applying a strong electric field on the sample 9. Further, there is an effect that it is possible to prevent the sample from being charged. Furthermore, by using a stage capable of tilting the sample 9 as the sample stage 119 and using the electric field control electrode 42 when the sample is tilted, the direction of the deceleration electric field can be maintained in the axial direction of the electron beam 19. By doing so, the secondary electrons 16 and the reflected electrons 15 from the tilted sample 9 can be accelerated by the deceleration electric field to be moved toward the electron beam source 1. Therefore, even in a case where the sample 9 is tilted, the efficiency detecting the secondary electrons 16 and the reflected electrons 15 can be maintained to a high efficiency.

Although the first and the second detectors 150, 151 are arranged between the upper scanning coil 26 and the aperture 25 in the construction of FIG. 5, it is also possible to employ a construction where a set of the first and the second detectors 150, 151 are additionally arranged between the lower scanning coil 27 and the objective lens 3. In a case where two sets of the detectors are arranged as described above, electrons emitted having large expanding angles to the axial direction of the electric beam 19 among the secondary electrons 16 and the reflected electrons 15 are detected by the first and second detectors 150, 151 between the lower scanning coil 27 and the objective lens 3. On the other hand, electrons having small expanding angles to the axial direction of the electric beam 19 among the secondary electrons 16 and the reflected electrons 15 pass through the through hole 48 of the first detector 150 between the lower scanning coil 27 and the objective lens 3 and are detected by the first and the second detectors 150, 151 between the upper scanning coil 26 and the aperture 25. Thereby, since scan images having shape contrast enhanced by different characteristics are obtained in the output of the upper side set of the first and the second detectors and in the output of the lower side set of the first and the second detectors, an scan image having a desired contrast can be selected. Further, by adding the outputs of the upper and the lower detectors, it is possible to obtain a normal scan image in which the secondary electrons 16 and the reflected electrons 15 are detected in high efficiency.

A third embodiment of a scanning electron microscope in accordance with the present invention will be described below, referring to FIG. 7.

Figure 7:
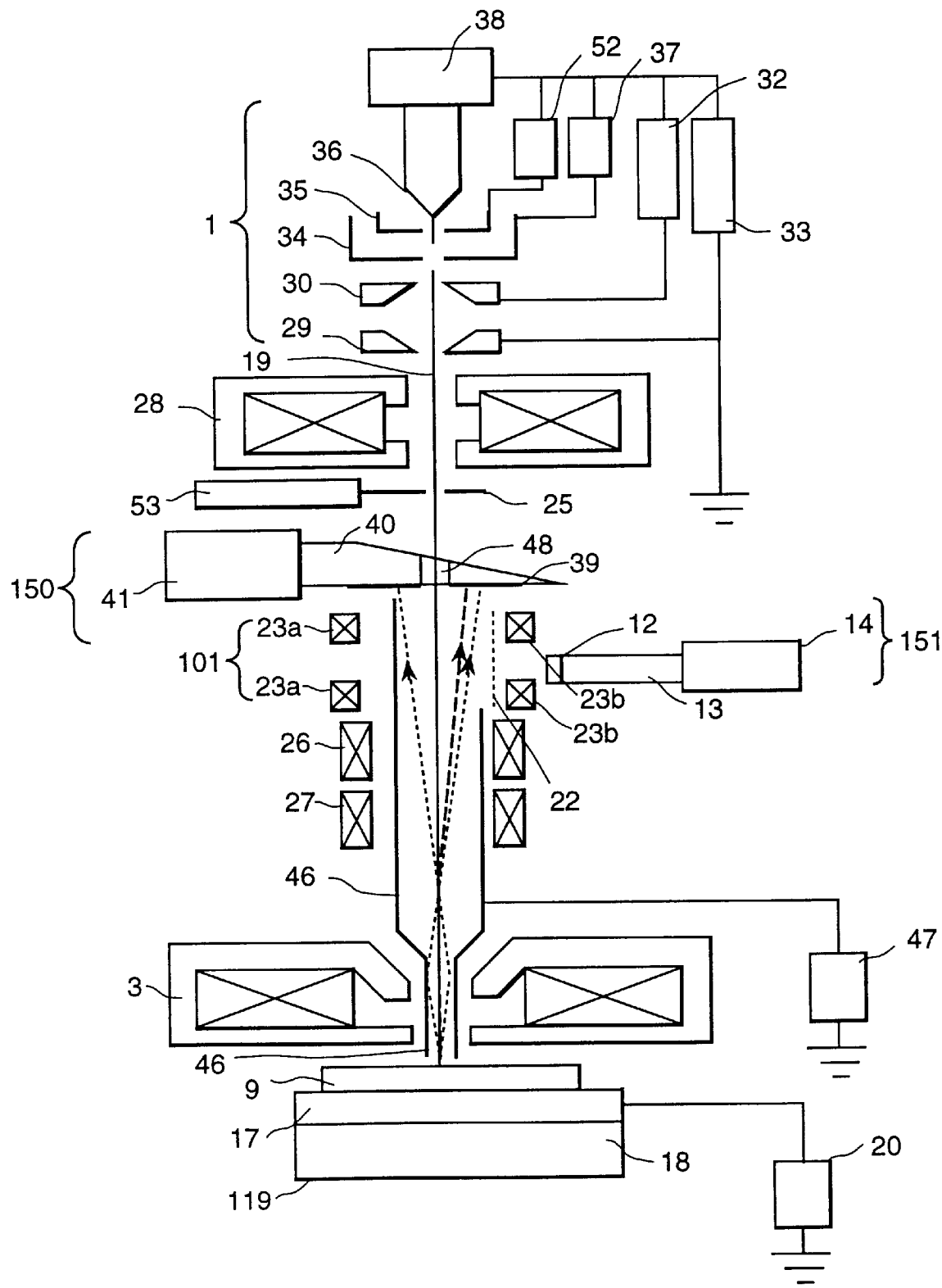
FIG. 7 is a block diagram showing the construction of a third embodiment of a scanning electron microscope of a retarding type in accordance with the present invention.

Parts in the construction of FIG. 7 having the same parts in the constructions of FIG. 3 and FIG. 5 are identified by the same reference characters, and descriptions of them are omitted. In FIG. 7, there is arranged a post acceleration electrode 46 having a long shape from the objective lens 3 up to the deflecting unit 101. A post acceleration voltage 47 is applied to the post acceleration electrode 46. Decelerating of the electron beam 19 just before the sample 9 is the same as that of FIG. 3, and is a method having an effect to improve the resolution under a low acceleration voltage. A voltage equal to that applied to the post acceleration electrode 46 is applied to the scintillator 39. An attracting voltage 5 higher than the post acceleration voltage 52 by several tens voltages positive is applied to the mesh electrode 22. Although the deflector under the lower scanning coil 27 is omitted in this embodiment, of course, it is possible to detect the reflected electrons by arranging it.

A first detector 250, a second detector 251 and the secondary electron deflecting unit 252, which can be used instead of the first detector 150, the second detector 151 and the secondary electron deflecting unit 101 in the second embodiment, will be described below, referring to FIG. 8. In the first detector 250, the scintillator 239 is arranged at a position deviated from the path of the electron beam 19 with an angle θ to the center axis. The secondary electrons 16 and reflected electrons 15 are deflected to a position of the scintillator 239 by the deflector 155 (not shown in FIG. 8)

placed in the bottom side to collide with the scintillator 239. Light emission of the scintillator 239 by the secondary electrons 16 and the reflected electrons 15 is conducted to the photomultiplier 241 by the light guide 240 to be converted to an electric signal. On the other hand, the signal secondary electrons 16b generated by collision of the secondary electrons 16 and the reflected electrons 15 with the scintillator 239 are attracted by the mesh-shaped deflecting electrode 252 applied with a positive voltage to pass through the deflecting electrode 252. Then, the signal secondary electrons 16b collide with the scintillator 212 (10 kV) arranged in the reverse side of the deflector 250 to make the scintillator 212 emit light. The emitted light is conducted to the photomultiplier 214 by the light guide 213 to be converted to an electric signal.

Figure 8:
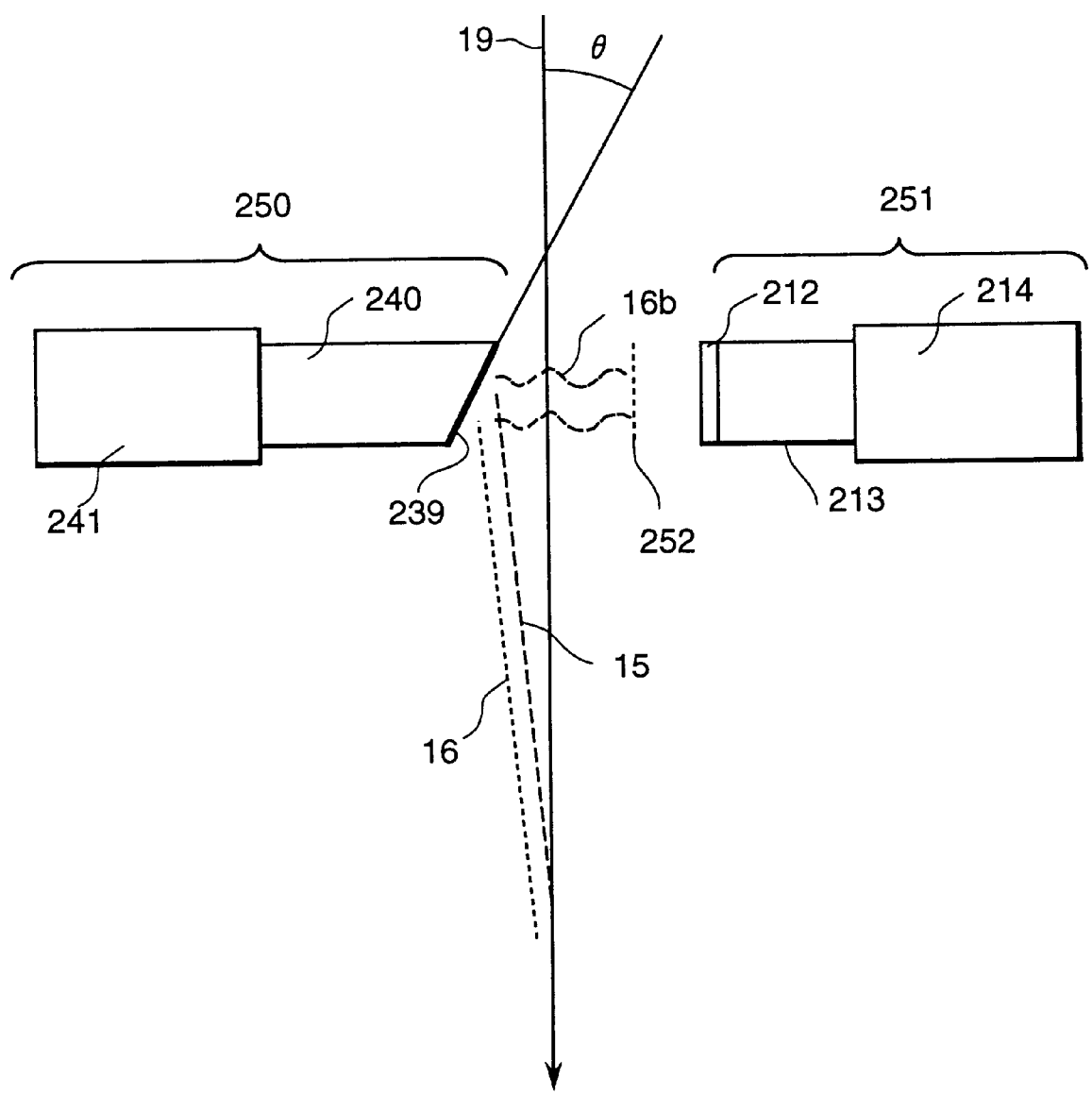
FIG. 8 is an explanatory view showing another construction of the first and second detectors which can be applied to an embodiment of the present invention.

The construction of FIG. 8 is characterized by that there is no need to provide the through hole 48 for allowing the electric beam 19 to pass through in the scintillator 239 and the efficiency of generating the signal secondary electrons 16b is increased because the secondary electrons 16 and the reflected electrons 15 are slantingly incident on the scintillator 239. Particularly, when the energy of the secondary electrons 16 and the reflected electrons 15 are high, the efficiency of generating the signal secondary electrons 16b is largely increased. Although the signal secondary electrons 16b are attracted by the deflecting electrode 252 in this embodiment, it is possible that a coil for generating a magnetic field intersecting with the electric field formed by the deflecting electrode 252 at right angle is arranged to correct the deflaction of the electric beam 19.

In the construction of FIG. 5, since a collision axis of the secondary electrons 16 and the reflected electrons 15 with the scintillator 39 is diverted from the axis of the electron beam 19 by the deflector 155, the through hole 48 of the scintillator 39 can be eliminated and arranged to be diverted from the axis of the electron beam 19.

A first detector 350 capable of being used instead of the first detector 150 in the embodiments of FIG. 3 and FIG. 5 will be described below, referring to FIG. 9 and FIG. 10. The first detector 350 is composed of two detectors 350a, 350b. The two detectors 350a, 350b are arranged so as to butt against the scintillators 339a, 339b, respectively. The electron beam 19 passes through portions of cuts 351a, 351b at the ends of the scintillators 339a, 339b. By providing the cuts 351a, 351b, the gap between the scintillators 339a, 339b can be made small. The output of the first detector 350 is obtained by adding the outputs of the photomultipliers 341a, 341b. Each of the electric signals of the photomultipliers 341a, 341b can be used as information for shape judgment or dimension measurement since each of them reflects the shape of the sample 9. The secondary electrons generated by the scintillators 339a, 339b are detected by the second detector 151 in the same manner as by the first detector 150.

Figure 9:
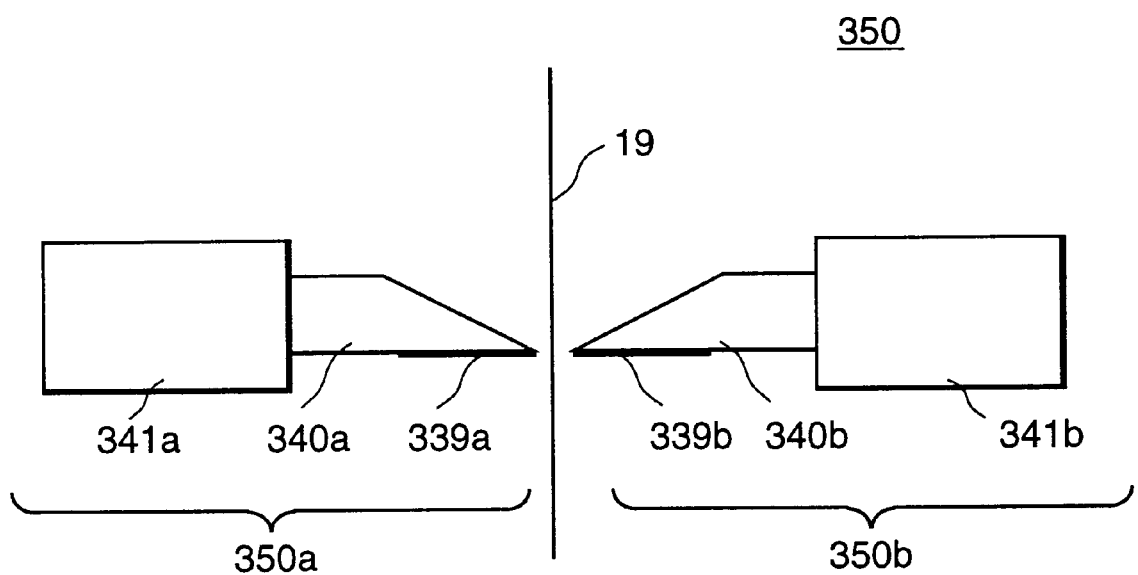
FIG. 9 is an explanatory view showing another construction of the first detector which can be applied to an embodiment of the present invention.
Figure 10:
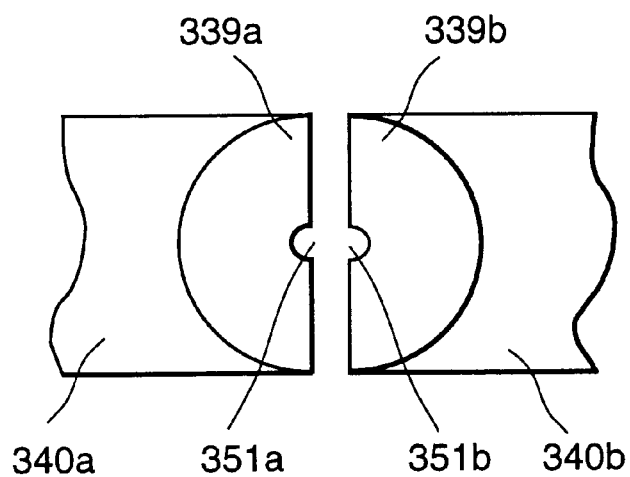
FIG. 10 is a bottom view of the first detector of FIG. 9 when seeing it from the sample side.

In the construction of FIG. 9, FIG. 10, it is possible to provide a gap for allowing the electron beam 19 to pass through between the detectors 350a, 350b and the cuts 351a, 351b can be eliminated. Further, it is possible to obtain more detailed shape information by butting four detectors.

Figure 11:
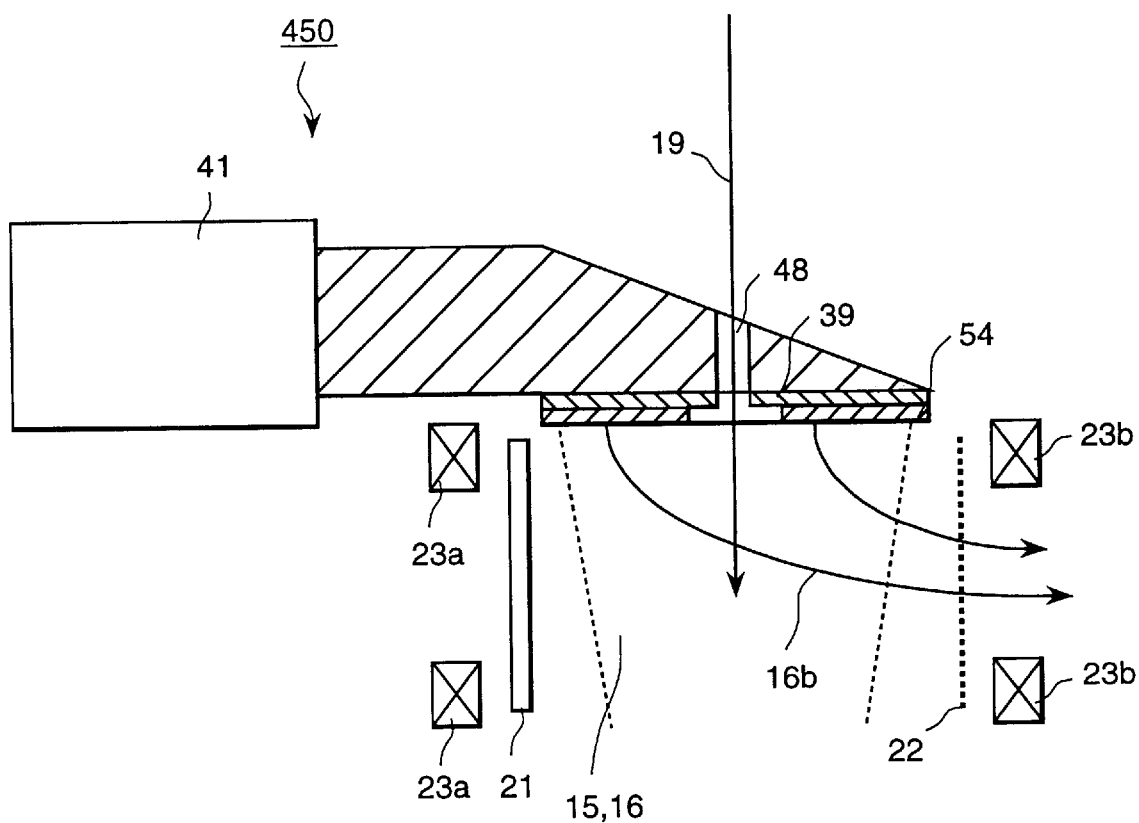
FIG. 11 is an explanatory view showing another construction of the first detector which can be applied to an embodiment of the present invention.

Further, a first detector 450 capable of being used instead of the first detector 150 of FIG. 3 will be described below, referring to FIG. 11. The first detector 450 shown in FIG. 11 is formed by providing a ring-shaped metallic plate 54 covering the scintillator 39 except for around the through hole 48 of the scintillator 39. The thickness of the metallic plate 54 is so thick that the reflected electrons 15 and the secondary electrons 16 can not pass through.

In the first detector 450, the scintillator 39 emits light only by the electrons traveling upward along the axis of the electron beam 19 among the reflected electrons 15 and the secondary electrons 16. Since the electrons having a large expanding angle along the axis of the electron beam 19 among the reflected electrons 15 and the secondary electrons 16 are collide with the metallic plate 54 and do not reach the scintillator 39. As a result, the photomultiplier 41 detects only the electrons traveling upward along the axis of the electron beam 19 among the reflected electrons 15 and the secondary electrons 16. On the other hand, since the signal secondary electrons 16b are generated from both the metallic plate 54 and the scintillator 39, the output of the photomultiplier 14 of the second detector (not shown in FIG. 11) reflect the total of the reflected electrons 15 and the secondary electrons 16.

At that time, when the energy of the secondary electrons 16 is low (for example, 800 V) and the energy of the reflected electrons 15 is high (for example, several kV), the output of the photomultiplier 41 reflects the electrons traveling upward along the axis of the electron beam 19 among the reflected electrons 15. When the sample 9 is observed under such a condition, the electrons reflected from bottom of a deep depression formed on the sample 9 (traveling upward along the axis of the electron beam 19 because the expanding angle is restricted by the side surfaces of the depression) can be efficiently detected by the photomultiplier 41. Thereby, the shape of the bottom of the depression on the sample 9 can be observed with a high contrast.

Further, by forming the metallic plate 54 and the metal layer of the scintillator 39 the same material in the construction of FIG. 11, it is possible to make generation of the secondary electrons uniform. Further more, a metallic layer having a sufficient thickness can be used instead of the metallic plate 54.

Description will be made, referring to FIG. 12, below on the construction of a fourth embodiment of a scanning electron microscope in which the acceleration voltage can be set in a wide range from a low acceleration voltage to a high acceleration voltage.

Figure 12:
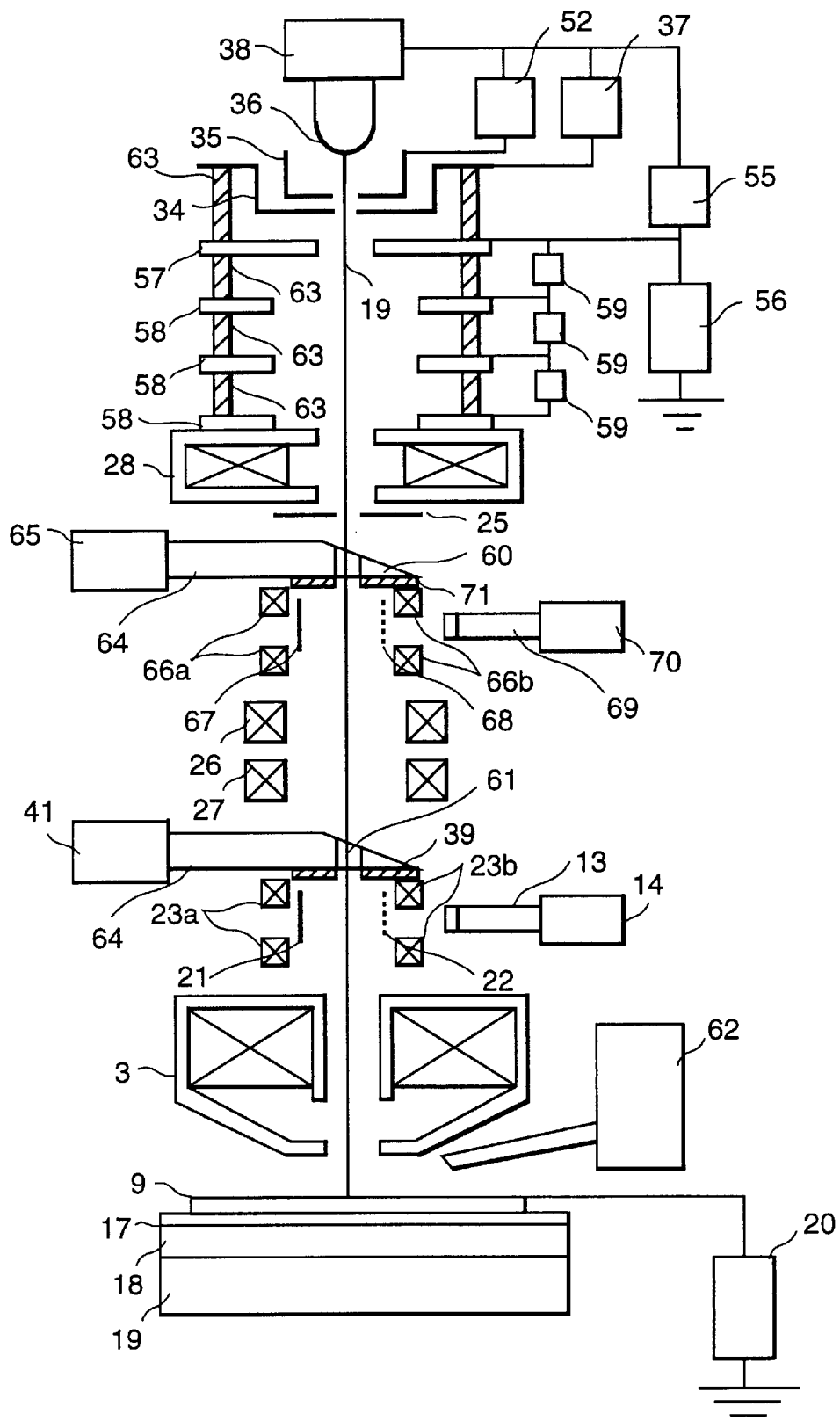
FIG. 12 a block diagram showing the construction of a fourth embodiment of a scanning electron microscope of a retarding type in accordance with the present invention.

Parts in the construction of FIG. 12 having the same parts in the constructions of FIG. 3 and FIG. 5 are identified by the same reference characters. In FIG. 12, the electron source 36 of Schottky type is heated by the heating power source 38, and the extraction voltage 37 is applied to the extraction electrode 34 to extract the electron beam 19. The suppresser 35 suppresses electrons to be emitted from portions other than the top end of the electron source 36 by a negative voltage supplied from the suppressing voltage 52. The electron beam 19 having pass through the extraction electrode 34 is adjusted to a desired energy (acceleration) by the first acceleration electrode 57 applied with the first acceleration voltage 55. For example, the first acceleration voltage is 5 kV which corresponds to a low acceleration voltage. When observation is performed under a low acceleration voltage, the second acceleration voltage 56 is not applied and the first acceleration electrode 57 becomes the grounded potential. On the other hand, a superposed voltage 20 of −4 kV is applied to the sample 9. Thereby, the electron beam (primary electron beam) 19 at the time incident on the sample 9 becomes 1 kv. By adjusting the superposed voltage 20, the acceleration voltage of the primary electron beam 19 can be adjusted.

On the other hand, when observation is performed under a high acceleration voltage, the second acceleration voltage 56 is applied. For example, when a voltage of 196 V is applied from the second acceleration voltage 56, the electron beam 19 becomes 201 kV. In this case, since voltage of −1 kV is applied to the sample 9 as the superposed voltage 20, the primary electron beam 1 incident on the sample 9 becomes 200 kV. In this embodiment, the second acceleration voltage 56 is applied stepwise using three second acceleration electrodes 59 divided by a dividing resistor 59 and fixed by insulators 56.

The electron beam 19 selected by the high acceleration voltage or the low acceleration voltage is converged on the sample 9 by the condenser lens 28 and the objective lens 3. The aperture 25 determines an opening angle of the electron beam 19. The converged electron beam 19 is scanned on the sample 9 by the scanning coil composed of the upper scanning coil 26 and the lower scanning coil 27. Therein, the electron beam 19 is adjusted so as to scan on the sample 9 through the lens center of the objective lens 3.

Detection of the secondary signal in the case of the high acceleration voltage will be described. In the case of the high acceleration voltage, the superposed voltage 20 of −1 kV is applied to the sample 9. The secondary electrons (not shown) generated by irradiation of the primary electron beam of high acceleration voltage (for example, 200 kV) are accelerated by the superposed voltage 20 and collide with the scintillator 39 receiving the lens action of the objective lens 3. The signal secondary electrons are efficiently generated since the collision energy is 1 kV. The output of the secondary electron multiplier 14 detected here is a quantity of secondary electrons generated by the sample 9. On the other hand, the reflected electrons generated by the sample 9 are received the lens action of the objective lens 3 and pass through the objective lens 3. Reflected electrons whose energy is largely decayed are scattered by the lens action of the objective lens to be detected by the scintillator 39. Reflected electrons energy of which is less decayed pass through the opening 61 and detected by the sintilator 71. That is, the reflected electrons are detected as outputs of the secondary electron multipliers 41 and 65.

In the case of the low acceleration voltage, the electron beam 19 of 5 kV becomes the primary electron beam of 1 kV by the superposed voltage 20 of −4 kV applied to the sample 9. The secondary electrons generated from the sample are accelerated to 4 kV by the superposed voltage 20. The reflected electrons are also accelerated to 5 kV at maximum. Both of the reflected electrons and the secondary electrons receive the lens action of the objective lens 3, and electrons, collide with the scintilator 39. The electrons which passed through the aperture of the scintillator 39 collide with the scintillator 71. Detection here is performed both by generation of the signal secondary electrons and light emission of the scintillator. The sum of outputs of the secondary electron multipliers 14, 41, 65, 70 become the total secondary signal. Since light emission of the scintillators 39, 71 contains a large quantity of reflected electron components, the light emission may be used for forming a scan image separately from the signal detected from the signal secondary electrons.

In the construction of FIG. 12, an X-ray detector 62 is arranged between the objective lens 3 and the sample 9. Using the X-ray detector 62, it is possible to specify elements in the sample 9 by detecting inherent X-rays generated by irradiation of an electron beam 19 within a range of acceleration voltage of 5 kV to 30 kV to the sample 9. Therein, the superposed voltage 20 of −1 kV is applied to the sample 9, similar to the case of the high acceleration voltage.

In each of the above-mentioned embodiments, a method of exchanging the sample 9 has not be described. In a semiconductor process, exchange of the sample (wafer) 9 is automatically performed by a robot hand. It is necessary to take it into consideration to switch off the superposed voltage 20 before the robot hand is in contact with the sample 9.

Figure 2:
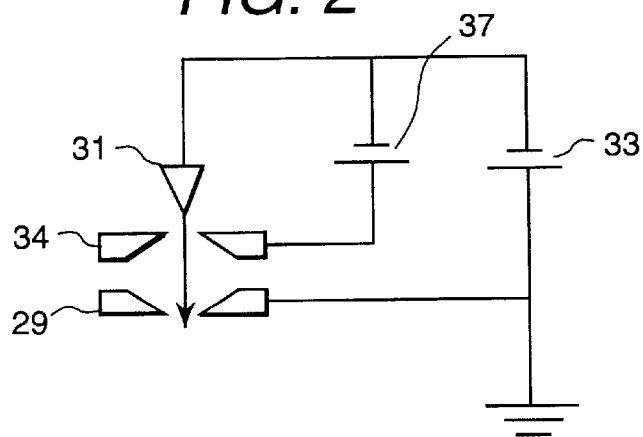
FIG. 2 is a block diagram showing the construction of an electron beam source of an electric field extraction type which can be applied to an embodiment of the present invention.

Each of the above-mentioned embodiments uses the electron beam source of Schottky type, but it is not limited to this. Of course, it is possible to use an electron beam source of electric field emission type, as shown in FIG. 2. In FIG. 2, An electric field emission type electron gun is composed of an electric field emission cathode 31, an extraction electrode 34, and an anode 29. An extraction voltage 37 is applied between the electric field emission cathode 31 and the extraction electrode 34, and an acceleration voltage 33 is applied to the electric field emission cathode 31. An electron beam 19 emitted from the electric emission cathode 31 is further accelerated between the extraction electrode 34 and the anode 29 in the ground electric potential. The energy (acceleration voltage) of the electron beam 19 having passed through the anode 29 agrees to the acceleration voltage 33.

As having been described, the construction in each of the embodiments of the scanning electron microscope is that not only the signal secondary electrons are generated on the surface of the first detector by the secondary electrons and the reflected electrons from the sample and detected by the second detector, but also the electrons reached the light emitting layer are directly detected by the first detector. Therefore, it is possible to attain a high detection efficiency exceeding that of conventional one. Further, by making use of the fact that a better efficiency generating the secondary electrons exists in an energy range around 1 kV and the fact that a better light emission efficiency of the scintillator exists in a range above several kV, it is possible to provide the construction capable of detecting the secondary electrons and the reflected electrons separately. Further, by detecting the reflected electrons and the secondary electrons using the separate detectors depending on the expanding angles, it is possible to provide the construction capable of obtaining sample scan images different in contrast. Thereby, it is possible to observe a bottom shape of a depression formed on the sample.

According to the present invention, it is possible to provide a scanning electron microscope which can efficiently detect secondary electrons from a sample and reflected electrons irrespective of magnitudes of an acceleration voltage and a deceleration voltage using the retarding method.

What is claimed is:

1. A scanning electron microscope comprising a sample holder for holding a sample; an electron beam source for accelerating said electrons and emitting an electron beam toward said sample; scanning means for scanning said electron beam on said sample; an objective lens for converging said electron beam on said sample; and a detector for detecting a secondary signals composed of at least one of secondary electrons and reflected electrons generated from said sample by irradiation of said electron beam, wherein said detector comprises a first detector and a second detector, said first detector being arranged at a position in which said secondary signals can collide with said first detector, having a construction to detect said secondary signals (signal secondary electrons) and to further emit secondary electrons by collision of said secondary signals, said second detector detecting the signal secondary electrons emitted from said first detector.

2. A scanning electron microscope according to claim 1, which further comprises a deceleration electric field forming means for forming a deceleration electric field to decelerate said electron beam, said deceleration electric field forming means being arranged in a space above said sample.

3. A scanning electron microscope according to claim 1, wherein said first detector comprises a light emitting member emitting light by irradiation of electrons; a metallic member arranged on a surface of said light emitting member; and a photodetector for detecting the light emitted by said light emitting member, said metallic member being arranged at a position in which said secondary signal can collide with said metallic member to emit said signal secondary electrons, said light emitting member emitting light by said secondary signals having transmitted through said metallic member.

4. A scanning electron microscope according to claim 1, wherein said first detector is arranged on a path of said electron beam and a through hole for passing through said electron beam is formed in said first detector.

5. A scanning electron microscope according to claim 3, wherein thickness of said metallic member is set in such a value that said reflected electrons among said secondary signal can be transmitted but said secondary electrons cannot be transmitted.

6. A scanning electron microscope according to claim 3, wherein thickness of said metallic member is such a value in a portion near a central axis of said secondary signal that at least part of said secondary signal can be transmitted and such a value in a portion apart from the central axis that said secondary signal cannot be transmitted.

7. A scanning electron microscope according to claim 1, which comprises a deflection means for deflecting the secondary electrons emitted by said first detector toward said secondary detector, said deflection means being arranged between said first detector and said second detector.

8. A scanning electron microscope according to claim 7, wherein said deflecting means comprises an electric field generating means for generating a static electric field in a direction attracting the secondary electrons emitted by said first detector toward said second detector; and a magnetic field generating means for applying a magnetic field canceling deflection generated in electron beam by said static electric field to said electron beam.

9. A scanning electron microscope according to claim 8, wherein said electric field generating means comprises a pair of electrodes, the electrode applied with positive voltage between said pair of electrodes being mesh-shaped to allow said attracted secondary electrons to pass through, said second detector being arranged so as to be opposite to said mesh-shaped electrode.

10. A scanning electron microscope according to claim 1, which further comprises a secondary deflecting means for deflecting the secondary signal from said sample toward said first detector.

11. A scanning electron microscope according to claim 2, wherein said deceleration electric field generating means comprises means for applying a negative voltage to said sample so as to form a deceleration electric field in a space between said objective lens and said sample.

12. A scanning electron microscope according to claim 2, wherein said deceleration electric field generating means comprises an electrode covering said sample so as to not be in contact with said sample; and means for applying an equal negative voltage to said sample and said electrode so as to form a deceleration electric field between said electrode and said objective lens.

13. A scanning electron microscope according to claim 1, wherein said first detector detects only electrons in a region around the center axis of said secondary signal among said secondary signal collide with said first detector, and electrons outside the region are used only for emitting secondary electrons.

14. A scanning electron microscope according to claim 1, which comprises two sets of said first detector and said second detector, one set of the two sets being arranged between said scanning means and said electron beam source, the other set being arranged between said scanning means and said objective lens.

15. A scanning electron microscope according to claim 1, wherein there is provided with arithmetic operation means for summing a detection result from said first detector and a detection result from said second detector to form signals forming a sample image.

* * * * *